(12) United States Patent
Chen

(10) Patent No.: US 10,186,471 B2
(45) Date of Patent: Jan. 22, 2019

(54) SOLID-STATE DRIVE DEVICE

(71) Applicant: Shannon Systems Ltd., Shanghai (CN)

(72) Inventor: Xiaoyan Chen, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 15/651,106

(22) Filed: Jul. 17, 2017

(65) Prior Publication Data
US 2018/0151469 A1   May 31, 2018

(30) Foreign Application Priority Data

Nov. 30, 2016 (CN) .......................... 2016 1 1079323

(51) Int. Cl.
| | |
|---|---|
| H05K 7/14 | (2006.01) |
| H05K 7/20 | (2006.01) |
| H01L 23/36 | (2006.01) |
| H01L 23/04 | (2006.01) |
| H01L 23/367 | (2006.01) |
| H05K 1/02 | (2006.01) |
| H01L 23/42 | (2006.01) |

(Continued)

(52) U.S. Cl.
CPC ............ H01L 23/3675 (2013.01); G06F 1/18 (2013.01); G06F 1/20 (2013.01); G11C 5/00 (2013.01); H01L 23/04 (2013.01); H01L 23/42 (2013.01); H05K 1/0201 (2013.01); H05K 7/20 (2013.01); H05K 2201/10159 (2013.01)

(58) Field of Classification Search
CPC .......... H05K 1/0201; H05K 7/14; H05K 7/20; H05K 7/20136; H05K 7/20154; H01L 23/3675; H01L 23/04; H01L 23/42; G06F 1/18; G06F 1/20; G11C 5/00
USPC ..... 361/695, 687, 699, 796, 679.31, 679.32, 361/679.49; 257/713, 772, E23.052, 257/E23.061, E23.105, E23.114, E21.503, 257/E21.506

See application file for complete search history.

(56) References Cited

U.S. PATENT DOCUMENTS

| | | | | |
|---|---|---|---|---|
| 5,361,188 A | * | 11/1994 | Kondou ................ | H01L 23/467 165/104.34 |
| 7,782,615 B1 | * | 8/2010 | Hao-Der ............ | H05K 7/20145 165/122 |

(Continued)

FOREIGN PATENT DOCUMENTS

| | | |
|---|---|---|
| CN | 202058453 U | 11/2011 |
| CN | 203689294 U | 7/2014 |

(Continued)

Primary Examiner — Dao H Nguyen
(74) Attorney, Agent, or Firm — McClure, Qualey & Rodack, LLP

(57) ABSTRACT

A solid-state drive device is provided. The solid-state drive device includes a housing, a first circuit board, and a second circuit board. The housing includes a first side and a second side. The first side is opposite to the second side. At least one first ventilation hole is formed on the first side. At least one second ventilation hole is formed on the second side. The first circuit board is disposed in the housing. The second circuit board is disposed in the housing. The second circuit board is coupled to the first circuit board. A gap is formed between the first circuit board and the second circuit board. The first ventilation hole and the second ventilation hole correspond to the gap.

19 Claims, 8 Drawing Sheets

(51) Int. Cl.
*G06F 1/20* (2006.01)
*G06F 1/18* (2006.01)
*G11C 5/00* (2006.01)

(56) References Cited

U.S. PATENT DOCUMENTS

| | | | | |
|---|---|---|---|---|
| 9,717,160 | B2* | 7/2017 | Hayashi | H05K 7/20136 |
| 9,750,128 | B2* | 8/2017 | Endo | H05K 1/0203 |
| 2005/0124221 | A1* | 6/2005 | Lin | H05K 7/20972 |
| | | | | 439/620.01 |
| 2005/0286221 | A1* | 12/2005 | Yamana | H05K 7/20736 |
| | | | | 361/679.46 |
| 2009/0086430 | A1* | 4/2009 | Kang | G02F 1/133385 |
| | | | | 361/695 |
| 2011/0199748 | A1* | 8/2011 | Kagawa | H05K 7/20436 |
| | | | | 361/796 |
| 2013/0044431 | A1* | 2/2013 | Koeneman | H01L 23/473 |
| | | | | 361/699 |
| 2013/0083481 | A1* | 4/2013 | Goto | H05K 7/20209 |
| | | | | 361/695 |
| 2013/0155600 | A1* | 6/2013 | Ross | H05K 7/1487 |
| | | | | 361/679.31 |
| 2013/0329364 | A1* | 12/2013 | Kameno | H05K 7/20563 |
| | | | | 361/697 |
| 2017/0099746 | A1* | 4/2017 | Rubenstein | H05K 7/20145 |
| 2018/0049349 | A1* | 2/2018 | Voss | H05K 7/20436 |

FOREIGN PATENT DOCUMENTS

| | | |
|---|---|---|
| TW | 201016085 A | 4/2010 |
| TW | 201027528 A | 7/2010 |
| TW | 201205589 A | 2/2012 |
| TW | M517895 U | 2/2016 |

* cited by examiner

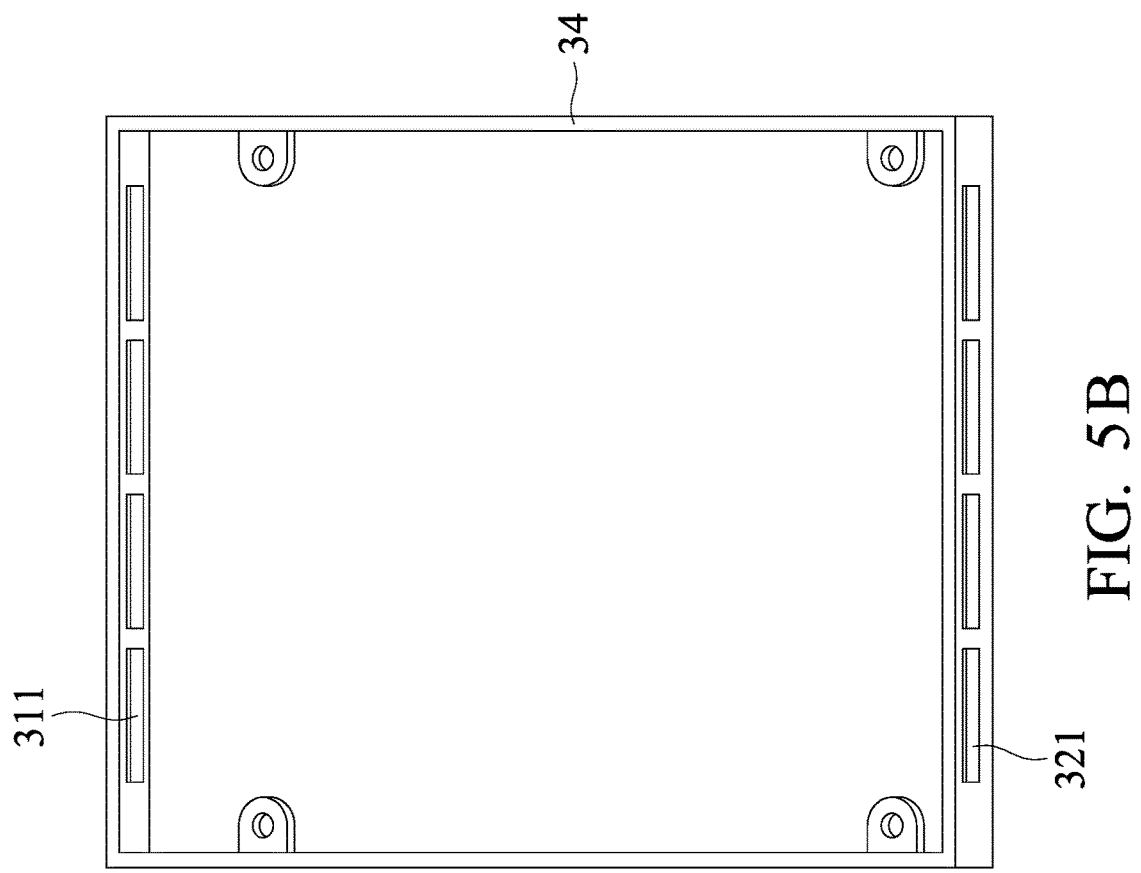

SOLID-STATE DRIVE DEVICE

CROSS REFERENCE TO RELATED APPLICATIONS

This Application claims priority of China Patent Application No. 201611079323.X, filed on Nov. 30, 2016, the entirety of which is incorporated by reference herein.

BACKGROUND OF THE INVENTION

Field of the Invention

The present invention relates to a solid-state drive device, and in particular to a solid-state drive device with improved heat dissipation.

Description of the Related Art

A conventional solid-state drive device utilizes a metal housing to remove the heat generated by the controller and the memory chips. However, with the increased storage capacity and assess capacity requirements of the solid-state drive device, the heat generated by the solid-state drive device cannot be sufficiently removed by only the metal housing.

Particularly when solid-state drive devices are utilized in a server, in which the solid-state drive devices are stacked, the heat on the metal housing cannot be sufficiently removed by convection.

BRIEF SUMMARY OF THE INVENTION

In one embodiment, a solid-state drive device is provided. The solid-state drive device includes a housing, a first circuit board, and a second circuit board. The housing includes a first side and a second side. The first side is opposite to the second side. At least one first ventilation hole is formed on the first side. At least one second ventilation hole is formed on the second side. The first circuit board is disposed in the housing. The second circuit board is disposed in the housing. The second circuit board is coupled to the first circuit board. A gap is formed between the first circuit board and the second circuit board. The first ventilation hole and the second ventilation hole correspond to the gap.

In one embodiment, the solid-state drive device further comprises a controller. The housing comprises a first member and a second member. The first member is combined with the second member. The controller is disposed on the first circuit board. The controller faces the first member. The controller is thermally connected to the first member by conduction.

In one embodiment, the solid-state drive device further comprises a plurality of first memory chips and a plurality of second memory chips. The first memory chips are disposed on the first circuit board. The second memory chips are disposed on the second circuit board. At least a portion of the first memory chips and at least a portion of the second memory chips are disposed in the gap.

In one embodiment, at least a portion of the first memory chips face the first member, and at least a portion of the second memory chips face the second member.

In one embodiment, at least a portion of the first memory chips and at least a portion of the second memory chips are located in the gap, and at least a portion of the first memory chips correspond to at least a portion of the second memory chips in the gap.

In one embodiment, the second memory chips comprise a second memory chip array, and at least a second flow path is defined by the second memory chip array.

In one embodiment, the first memory chips comprise a first memory chip array, at least a first flow path is defined by the first memory chip array, and the first flow path corresponds to the second flow path.

In one embodiment, the solid-state drive device further comprises a plurality of conversion head screws, and a plurality of fastening screws, each conversion head screw comprises a convex portion and a concave portion, the convex portion affixes the first circuit board to the first member, and the fastening screw affixes the second circuit board to the concave portion.

In one embodiment, the solid-state drive device further comprises a plurality of fixing screws, and the fixing screws directly affix the first member to the second member.

In one embodiment, the first member comprises a recess and a heat dissipation structure, the recess is formed on an inner surface of the first member and faces the controller, and the heat dissipation structure is formed on an outer surface of the first member.

Utilizing the solid-state drive device of the embodiment, the first ventilation hole and the second ventilation hole correspond to the gap. Air flow enters the housing and removes the heat from the heat sources (such as memory chips) which are located in the gap. The heat inside the housing is removed by convection, and heat dissipation efficiency is improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 5B shows the inner surface of the second member of an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
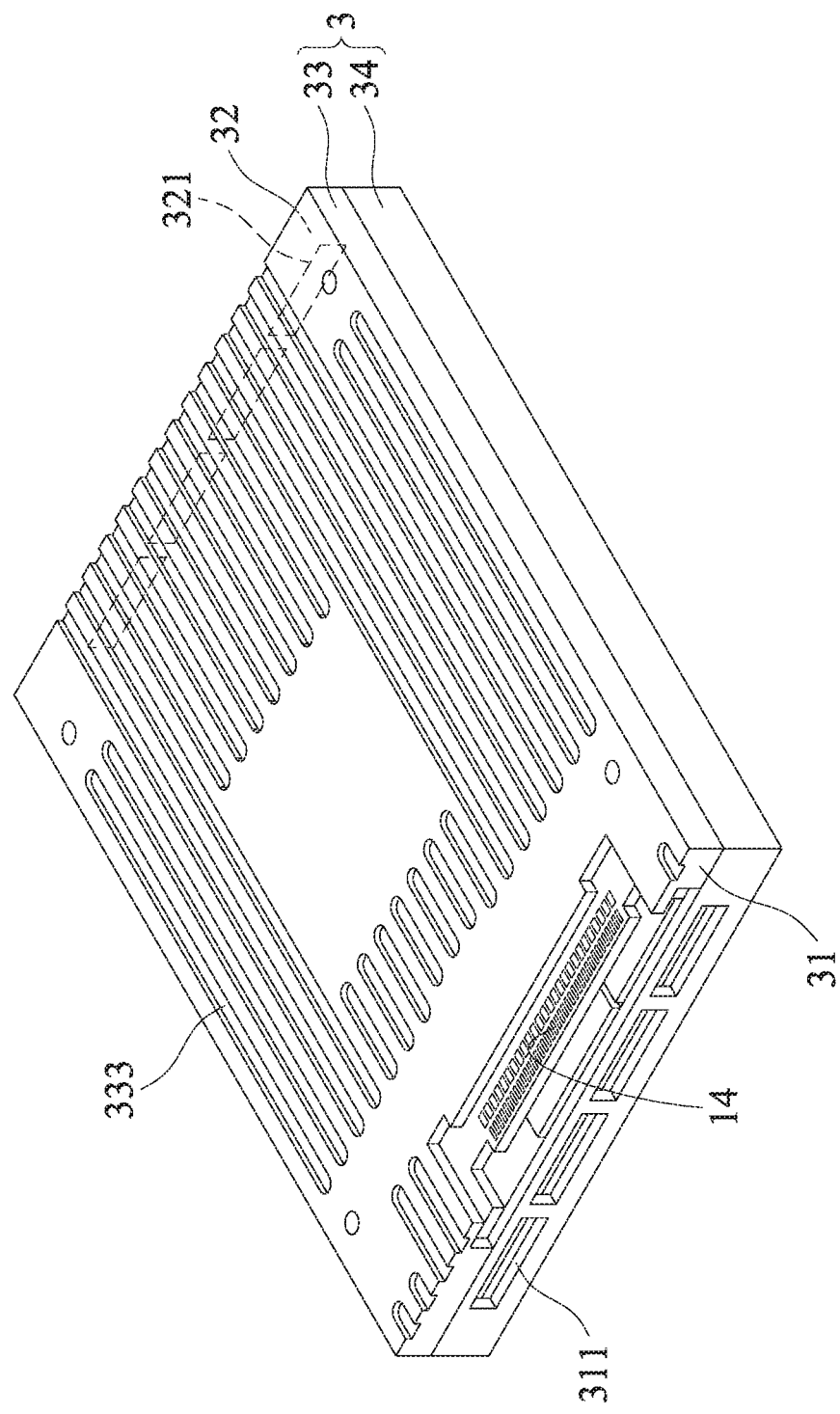
FIG. 1 is a perspective view of a solid-state drive device of an embodiment of the invention.
Figure 2:
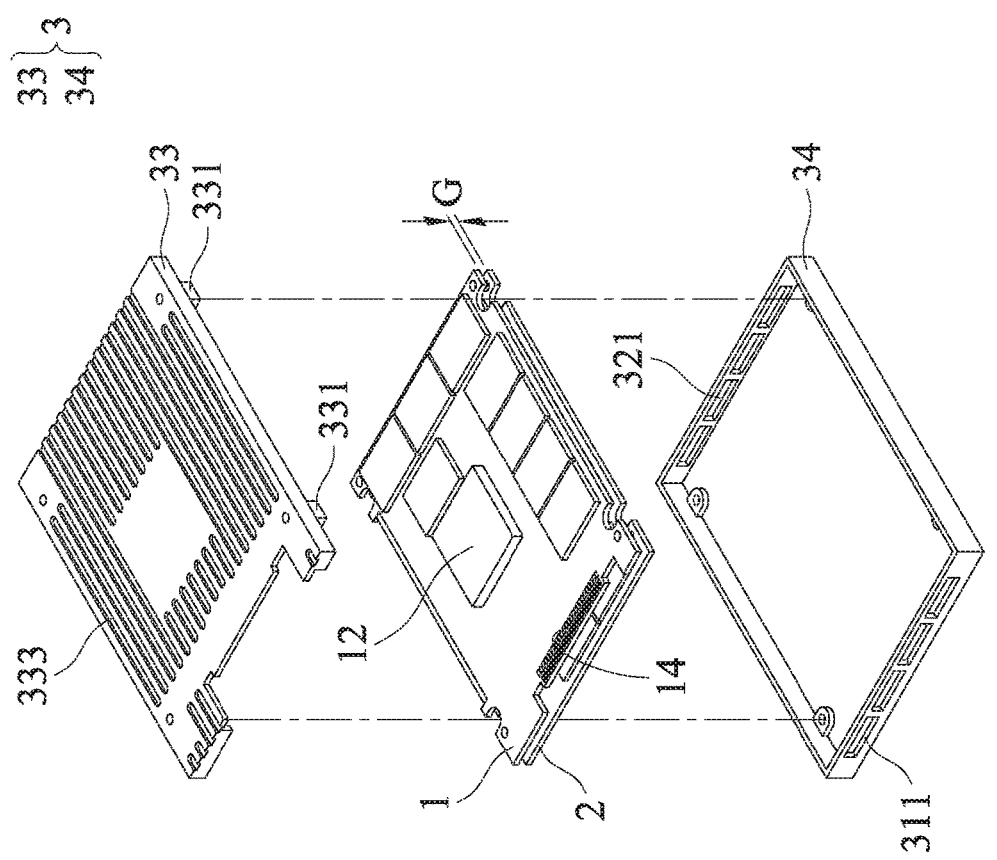
FIG. 2 is an exploded view of the solid-state drive device of the embodiment of the invention.

FIG. 1 is a perspective view of a solid-state drive device of an embodiment of the invention. FIG. 2 is an exploded view of the solid-state drive device of the embodiment of the invention. With reference to FIGS. 1 and 2, the solid-state drive device includes a housing 3, a first circuit board 1 and a second circuit board 2. The housing 3 includes a first side 31 and a second side 32. The first side 31 is opposite to the second side 32. At least one first ventilation hole 311 is formed on the first side 31. At least one second ventilation hole 321 is formed on the second side 32. The first circuit board 1 is disposed in the housing 3. The second circuit board 2 is disposed in the housing 3. The second circuit board 2 is coupled to the first circuit board 1. A gap G is formed between the first circuit board 1 and the second circuit board 2. The first ventilation hole 311 and the second ventilation hole 321 correspond to the gap G.

The first ventilation hole 311 and the second ventilation hole 321 correspond to the gap G. In one embodiment, air flow enters the housing 3 through the first ventilation hole 311 and leaves the housing 3 through the second ventilation hole 321. In another embodiment, the air flow enters the housing 3 through the second ventilation hole 321 and leaves the housing 3 through the first ventilation hole 311. The air flow can be impelled by a blower or a fan. The air flow enters the housing 3 and removes the heat from the heat sources (such as memory chips) which are located in the gap G. The heat inside the housing 3 is removed by convection, and heat dissipation efficiency is improved. The number, shape and dimensions of the first ventilation hole 311 and the second ventilation hole 321 can be modified. The disclosure is not meant to restrict the invention.

Figure 3A:
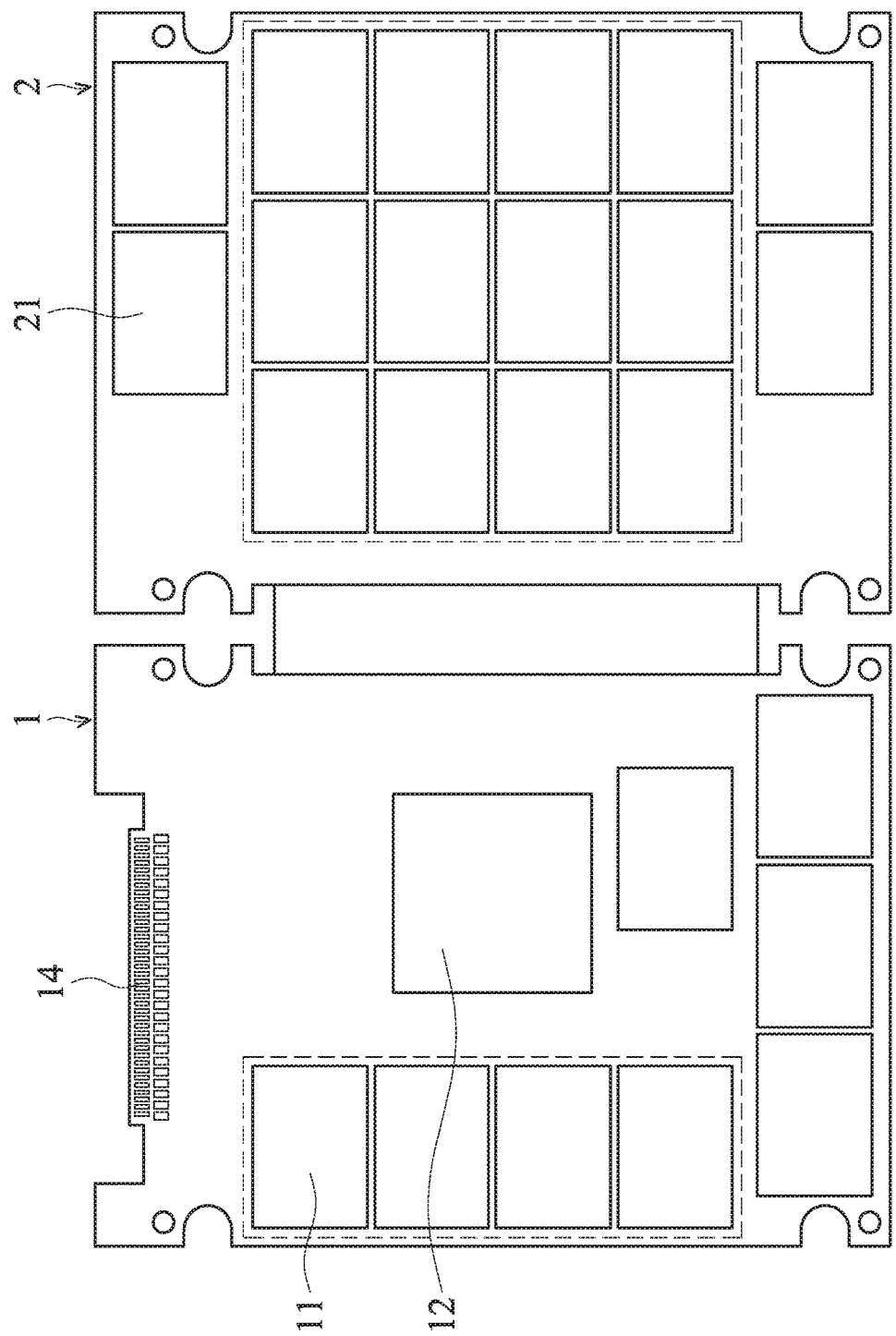
FIG. 3A shows details of the first circuit board and the second circuit board from one side.
Figure 3B:
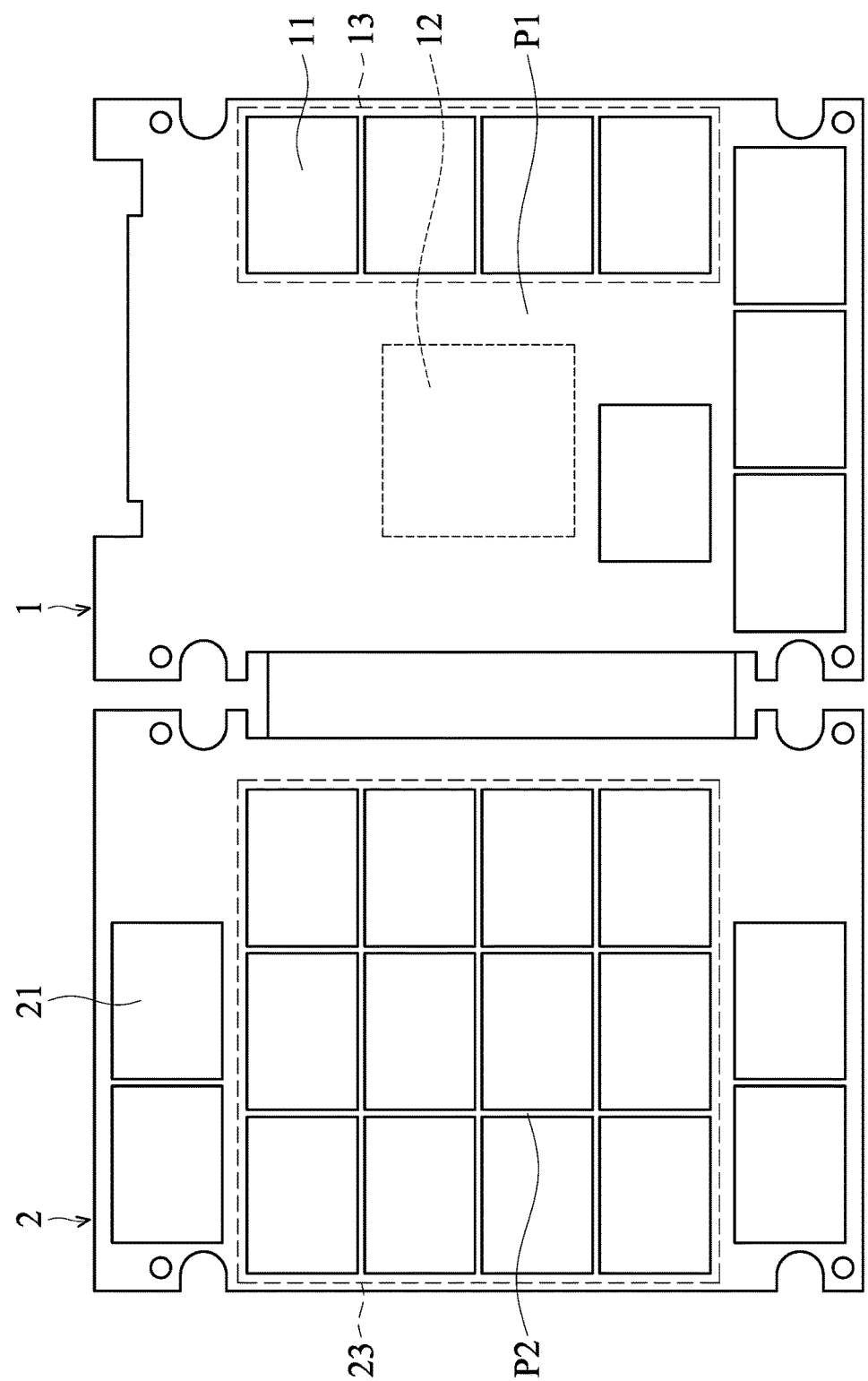
FIG. 3B shows details of the first circuit board and the second circuit board from the other side.

FIG. 3A shows details of the first circuit board 1 and the second circuit board 2 from one side. FIG. 3B shows details of the first circuit board 1 and the second circuit board 2 from the other side. With reference to FIGS. 2 and 3A, in one embodiment, the solid-state drive device further comprises a controller 12 and a gold finger area 14. The housing 3 comprises a first member 33 and a second member 34. The first member 33 is combined with the second member 34. The controller 12 is disposed on the first circuit board 1. The controller 12 faces the first member 33. The controller 12 is thermally connected to the first member 33 by conduction. For example, the controller 12 is thermally connected to the first member 33 by thermal glue, or a thermal pad, or by utilizing the thermal glue and the thermal pad simultaneously. In another embodiment, the controller 12 can be in direct contact with the first member 33. The heat generated by the controller 12 is removed by the housing 3, and the housing is made of metal.

Figure 4:
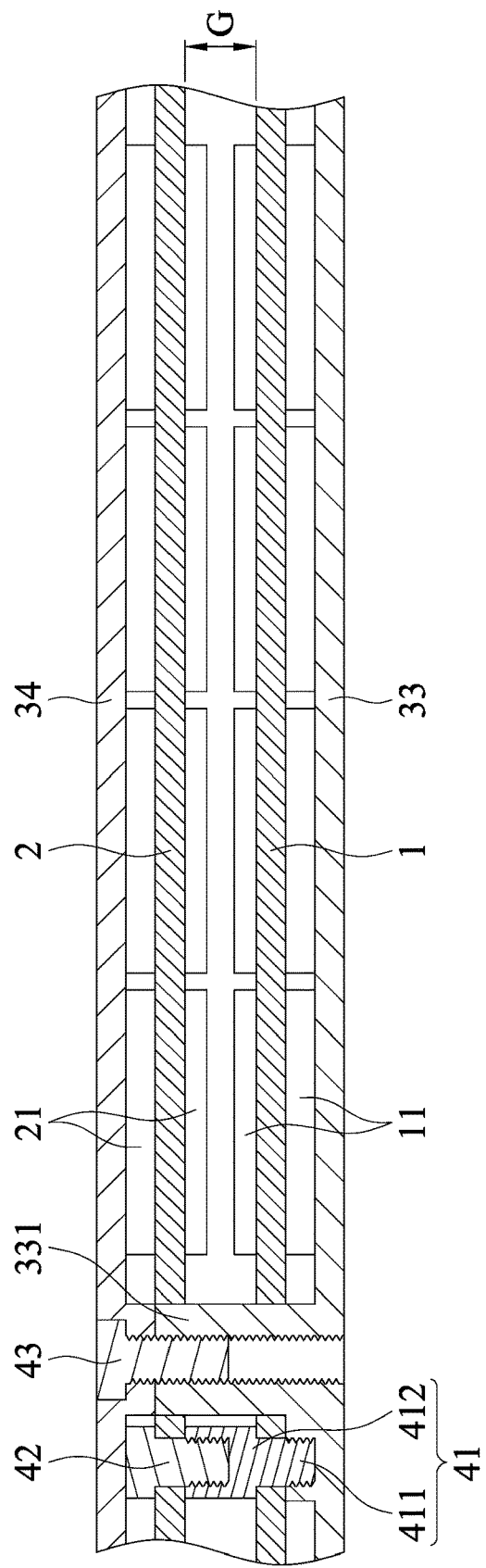
FIG. 4 is a side view of the first circuit board and the second circuit board.

With reference to FIGS. 3A and 3B, in one embodiment, the solid-state drive device further comprises a plurality of first memory chips 11 and a plurality of second memory chips 21. The first memory chips 11 are disposed on the first circuit board 1. The second memory chips 21 are disposed on the second circuit board 2. FIG. 4 is a side view of the first circuit board 1 and the second circuit board 2. With reference to FIG. 4, at least a portion of the first memory chips 11 and at least a portion of the second memory chips 21 are disposed in the gap G. In this embodiment, at least a portion of the first memory chips 11 face the first member 33, and the heat generated thereby are removed by conduction via the first member 33. At least a portion of the second memory chips 21 face the second member 34, and the heat generated thereby are removed by conduction via the second member 34. However, the disclosure is not meant to restrict the invention. For example, in one embodiment, all of the first memory chips 11 are located in the gap G. Similarly, in another embodiment, all of the second memory chips 21 face the second member 34.

In one embodiment, the heat dissipation due to convection inside the housing 3 is improved by the arrangement of the first memory chips 11 and the second memory chips 21. With reference to FIG. 3B, in one embodiment, at least a portion of the first memory chips 11 and at least a portion of the second memory chips 21 are located in the gap, and at least a portion of the first memory chips 11 correspond to at least a portion of the second memory chips 21 in the gap. The second memory chips 21 comprise a second memory chip array 23, and at least a second flow path P2 is defined by the second memory chip array 23. The first memory chips 11 comprise a first memory chip array 13, and at least a first flow path P1 is defined by the first memory chip array 13. The first flow path P1 corresponds to the second flow path P2. A large flow path is formed by combining the first flow path P1 and the second flow path P2. The air flow that travels in the large flow path has an increased flow rate, and provides improved heat dissipation efficiency.

Figure 5A:
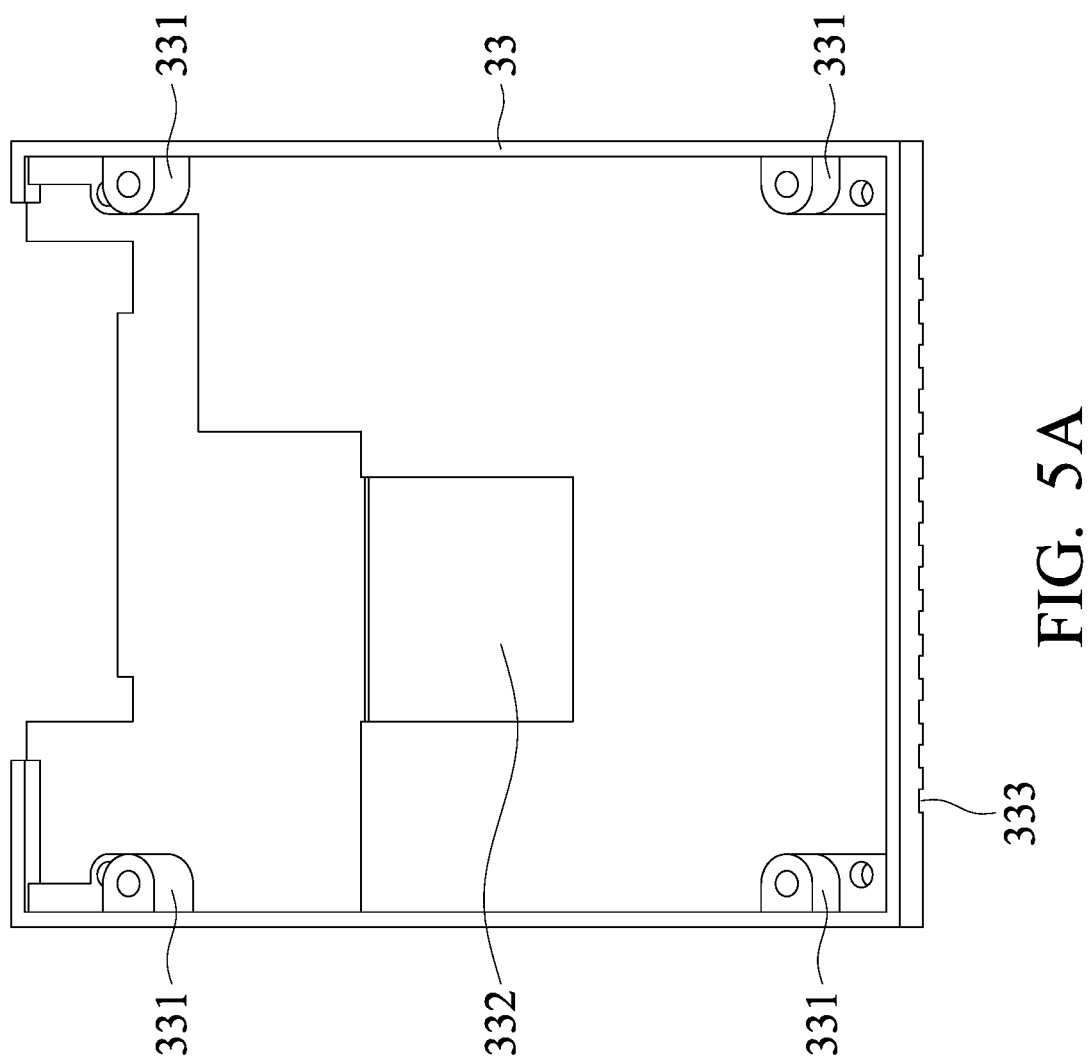
FIG. 5A shows the inner surface of the first member of an embodiment of the invention.

FIG. 5A shows the inner surface of the first member 33 of an embodiment of the invention. FIG. 5B shows the inner surface of the second member 34 of an embodiment of the invention. With reference to FIGS. 4, 5A and 5B, in one embodiment, the solid-state drive device further comprises a plurality of conversion head screws 41, and a plurality of fastening screws 42. Each conversion head screw 41 comprises a convex portion 411 and a concave portion 412. The convex portion 411 affixes the first circuit board 1 to the first member 33, and the fastening screw 42 affixes the second circuit board 2 to the concave portion 412.

With reference to FIGS. 4, 5A and 5B, in one embodiment, the solid-state drive device further comprises a plurality of fixing screws 43, and the fixing screws 43 directly affix the first member 33 to the second member 34. A plurality of fixing holes are formed on the first member 33 to be connected with of the fixing screws 43.

With reference to FIG. 5A, in one embodiment, the first member 33 comprises a recess 332. The recess 332 is formed on the inner surface of the first member 33 and faces the controller 12. Because the height of the controller 12 is greater than the height of the memory chip, the recess 332 improves the smoothness and the appearance of the solid-state drive device.

Figure 6:
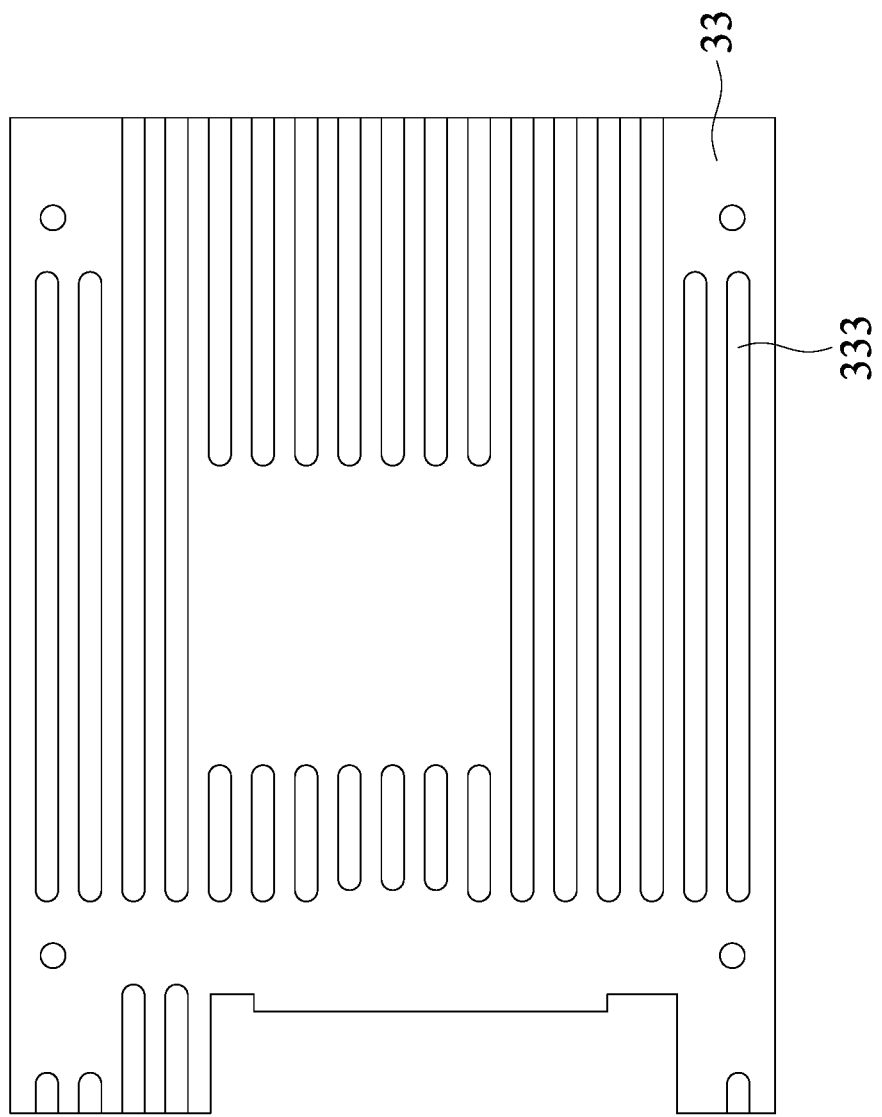
FIG. 6 shows an outer surface of the first member of an embodiment of the invention.

FIG. 6 shows an outer surface of the first member 33 of an embodiment of the invention. With reference to FIG. 6, a heat dissipation structure 333 is formed on the outer surface of the first member 33. The heat dissipation structure 333 comprises concave and convex structures to provide improved heat dissipation efficiency. In particular, the temperature of the controller 12 is greater than that of the memory chips. The heat dissipation structure 333 formed on the first member 33 removes the heat generated by the controller 12.

In one embodiment, the ventilation holes of a plurality of solid-state drive devices correspond to each other, and the ventilation holes are communicated in series to form one flow path to remove heat from the solid-state drive devices.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state drive device, comprising:
a housing, comprising a first side and a second side, wherein the first side is opposite to the second side, at least one first ventilation hole is formed on the first side, and at least one second ventilation hole is formed on the second side;
a first circuit board, disposed in the housing; and
a second circuit board, disposed in the housing, wherein the second circuit board is coupled to the first circuit board, a gap is formed between the first circuit board and the second circuit board, and the first ventilation hole and the second ventilation hole correspond to the gap; and
a controller, wherein the housing comprises a first member and a second member, the first member is combined with the second member, the controller is disposed on the first circuit board, the controller faces the first member, and the controller is thermally connected to the first member by solid conduction,
wherein there is no spacing metal plate formed between the first circuit board and the second circuit board,
wherein the first circuit board and the second circuit board are substantial the same size.

2. The solid-state drive device as claimed in claim 1, further comprising a plurality of first memory chips and a plurality of second memory chips, the first memory chips are disposed on the first circuit board, the second memory chips are disposed on the second circuit board, and at least a portion of the first memory chips and at least a portion of the second memory chips are disposed in the gap.

3. The solid-state drive device as claimed in claim 2, wherein at least a portion of the first memory chips face the first member, and at least a portion of the second memory chips face the second member.

4. The solid-state drive device as claimed in claim 3, wherein at least a portion of the first memory chips and at least a portion of the second memory chips are located in the gap, and at least a portion of the first memory chips correspond to at least a portion of the second memory chips in the gap.

5. The solid-state drive device as claimed in claim 4, wherein the second memory chips comprise a second memory chip array, and at least a second flow path is defined by the second memory chip array.

6. The solid-state drive device as claimed in claim 5, wherein the first memory chips comprise a first memory chip array, at least a first flow path is defined by the first memory chip array, and the first flow path corresponds to the second flow path.

7. The solid-state drive device as claimed in claim 2, further comprising a plurality of conversion head screws and a plurality of fastening screws, wherein each conversion head screw comprises a convex portion and a concave portion, the convex portion affixes the first circuit board to the first member, and each fastening screw affixes the second circuit board to the concave portion.

8. The solid-state drive device as claimed in claim 7, further comprising a plurality of fixing screws, and the fixing screws directly affix the first member to the second member.

9. The solid-state drive device as claimed in claim 2, wherein the first member comprises a recess and a heat dissipation structure, the recess is formed on an inner surface of the first member and faces the controller, and the heat dissipation structure is formed on an outer surface of the first member.

10. A solid-state drive device, comprising:
a housing, comprising a first side and a second side, wherein the first side is opposite to the second side, at least one first ventilation hole is formed on the first side, and at least one second ventilation hole is formed on the second side;
a first circuit board, disposed in the housing, wherein the first circuit board comprises a gold finger area; and
a second circuit board, disposed in the housing, wherein the second circuit board is coupled to the first circuit board, a gap is formed between the first circuit board and the second circuit board, and the first ventilation hole and the second ventilation hole correspond to the gap,
wherein the whole solid-state drive device is adapted to be coupled to a computer or a server merely via the gold finger area,
wherein there is no spacing metal plate formed between the first circuit board and the second circuit board.

11. The solid-state drive device as claimed in claim 10, further comprising a controller, wherein the housing comprises a first member and a second member, the first member is combined with the second member, the controller is disposed on the first circuit board, the controller faces the first member, and the controller is thermally connected to the first member by conduction.

12. The solid-state drive device as claimed in claim 11, further comprising a plurality of first memory chips and a plurality of second memory chips, the first memory chips are disposed on the first circuit board, the second memory chips are disposed on the second circuit board, and at least a portion of the first memory chips and at least a portion of the second memory chips are disposed in the gap.

13. The solid-state drive device as claimed in claim 12, wherein at least a portion of the first memory chips face the first member, and at least a portion of the second memory chips face the second member.

14. The solid-state drive device as claimed in claim 13, wherein at least a portion of the first memory chips and at least a portion of the second memory chips are located in the gap, and at least a portion of the first memory chips correspond to at least a portion of the second memory chips in the gap.

15. The solid-state drive device as claimed in claim 14, wherein the second memory chips comprise a second memory chip array, and at least a second flow path is defined by the second memory chip array.

16. The solid-state drive device as claimed in claim 15, wherein the first memory chips comprise a first memory chip array, at least a first flow path is defined by the first memory chip array, and the first flow path corresponds to the second flow path.

17. The solid-state drive device as claimed in claim 12, further comprising a plurality of conversion head screws and a plurality of fastening screws, wherein each conversion head screw comprises a convex portion and a concave portion, the convex portion affixes the first circuit board to the first member, and each fastening screw affixes the second circuit board to the concave portion.

18. The solid-state drive device as claimed in claim 17, further comprising a plurality of fixing screws, and the fixing screws directly affix the first member to the second member.

19. The solid-state drive device as claimed in claim 12, wherein the first member comprises a recess and a heat dissipation structure, the recess is formed on an inner surface of the first member and faces the controller, and the heat dissipation structure is formed on an outer surface of the first member.

* * * * *